US012690362B2

(12) United States Patent
Cho et al.

(10) Patent No.: US 12,690,362 B2
(45) Date of Patent: Jul. 21, 2026

(54) DISPLAY DEVICE INCLUDING COVER LAYER SURROUNDING DRIVING CHIP

(71) Applicant: SAMSUNG DISPLAY CO., LTD., Yongin-si (KR)

(72) Inventors: Ye Won Cho, Yongin-si (KR); Young Min Cho, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 323 days.

(21) Appl. No.: 18/528,915

(22) Filed: Dec. 5, 2023

(65) Prior Publication Data

US 2024/0381738 A1      Nov. 14, 2024

(30) Foreign Application Priority Data

May 12, 2023      (KR) ........................ 10-2023-0062001

(51) Int. Cl.
| | |
|---|---|
| *H10K 59/80* | (2023.01) |
| *H10K 59/90* | (2026.01) |
| *H10K 102/00* | (2023.01) |
| *H10W 90/00* | (2026.01) |

(52) U.S. Cl.
CPC ............. *H10K 59/80* (2023.02); *H10K 59/90* (2023.02); *H10K 2102/311* (2023.02); *H10W 90/00* (2026.01)

(58) Field of Classification Search
CPC .. H10K 59/80; H10K 59/90; H10K 2102/311; H10K 59/131; H10K 59/8794; H10K 77/111; H10K 59/129; H10K 59/87; H10K 71/70; H10W 90/00; G02F 1/133305; G09F 9/301
See application file for complete search history.

(56) References Cited

U.S. PATENT DOCUMENTS

| | | | |
|---|---|---|---|
| 7,936,066 B2 | 5/2011 | Lee et al. | |
| 8,823,042 B2 | 9/2014 | Kim | |
| 2021/0280826 A1* | 9/2021 | Kim ...................... G06F 1/1652 |
| 2023/0254978 A1* | 8/2023 | Zhang ................... H10K 59/40 |
| | | | 313/506 |

FOREIGN PATENT DOCUMENTS

| | | |
|---|---|---|
| JP | 2009-164562 | 7/2009 |
| JP | 2010-060883 | 3/2010 |
| KR | 10-2010-0026072 | 3/2010 |
| KR | 10-1383085 | 4/2014 |

* cited by examiner

*Primary Examiner* — J.E. Schoenholtz
(74) *Attorney, Agent, or Firm* — F. CHAU & ASSOCIATES, LLC

(57) ABSTRACT

A display device including: a display panel including a first area, a second area that can be bent from the first area, and a third area extending from the second area; a driving chip disposed in the third area; a connection substrate including a first hole wherein the first hole overlaps the driving chip and the third area; and a cover layer disposed in the third area wherein the cover layer contacts one or more sides of the driving chip.

21 Claims, 8 Drawing Sheets

DISPLAY DEVICE INCLUDING COVER LAYER SURROUNDING DRIVING CHIP

This application claims priority under 35 U.S.C. § 119 to Korean Patent Application No. 10-2023-0062001, filed on May 12, 2023, the disclosure of which is incorporated by reference herein in its entirety.

1. TECHNICAL FIELD

Embodiments of the invention relate to a display device.

2. DESCRIPTION OF THE RELATED ART

The advancement of information technology underscores the importance of display devices as interfaces between users and information. Consequently, the use of a display device such as liquid crystal display devices and organic light emitting display devices is on the rise.

Recently, as technology develops, display devices including a flexible display panel that is bent at a predetermined curvature are being developed.

SUMMARY

An embodiment of the present invention provides a display device capable of reducing interference between a driving chip and a connection substrate and protecting the driving chip from an external element.

An embodiment of the present invention provides a display device including: a display panel including a first area, a second area that can be bent from the first area, and a third area extending from the second area; a driving chip disposed in the third area; a connection substrate including a first hole, wherein the first hole overlaps the driving chip and the third area; and a cover layer disposed in the third area, wherein the cover layer contacts a side of the driving chip.

In an embodiment, the cover layer is disposed on more than one side of the driving chip.

In an embodiment, a thickness of the cover layer decreases as a distance of the cover layer from the driving chip increases.

In an embodiment, a thickness of the cover layer is the same as a thickness of the driving chip.

In an embodiment, the cover layer includes a thermally conductive polymer and a heat dissipation material.

In an embodiment, the thermally conductive polymer includes polyethylenedioxythiophene, polysulfonate, polythiophene, polyaniline, polypyrrole, or polyacetylene.

In an embodiment, the heat dissipation material includes aluminum, copper, silver, graphene, or graphite.

In an embodiment, adhesion of the cover layer to the driving chip is 3.5 N/cm or more.

In an embodiment, a modulus of the cover layer is 250 MPa or more.

In an embodiment, moisture permeability of the cover layer is 5 to 30 g/m³.

In an embodiment, the first hole overlaps the cover layer.

In an embodiment, the display device further including: a first protective film disposed on a rear surface of the first area; and a second protective film disposed on a rear surface of the third area.

In an embodiment, the display device further including: a first connection pad disposed in the third area, wherein the first connection pad is connected to a line extending from a display area of the display panel.

In an embodiment, the connection substrate further includes a second connection pad connected to the first connection pad.

In an embodiment, the connection substrate further includes a plurality of test points disposed in a test area.

In an embodiment, the connection substrate further includes a plurality of second holes overlapping the third area and spaced apart from each other.

In an embodiment, the second holes do not overlap the test area.

In an embodiment, the second holes are filled with resin.

In an embodiment, the resin contacts the third area.

In an embodiment, the resin includes acrylic resin, urethane resin, olefin resin, imide resin, amide resin, ester resin, isocyanate resin, epoxy resin, or silicone resin.

An embodiment of the present invention provides a display device including: a display panel including a first area, a second area bendable from the first area, and a third area extending from the second area, wherein when the second area is bent, the first area overlaps the third area; a driving chip disposed in the third area; a cover layer disposed on opposite sides of the driving chip; and a connection substrate that includes an opening that exposes the driving chip and the cover layer.

DETAILED DESCRIPTION OF THE EMBODIMENTS

Figure 1:
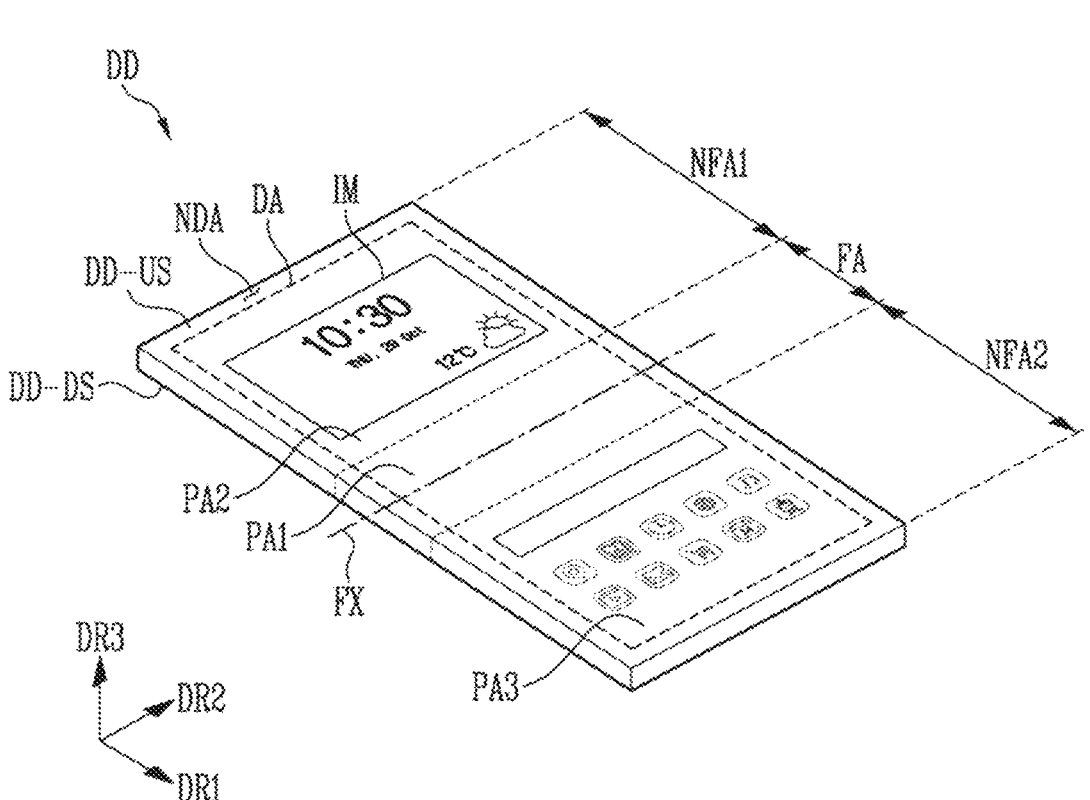
FIG. 1 is a perspective view of a display device in accordance with an embodiment of the invention.

Example embodiments will now be described more fully hereinafter with reference to the accompanying drawings; however, they may be embodied in many different forms and should not be construed as limited to the embodiments set forth herein.

Like numbers designate like elements throughout. In the drawings, the thickness of certain lines, layers, components, elements or features may be exaggerated for clarity. It will be understood that, although the terms "first", "second", etc. may be used herein to describe various elements, these elements should not be limited by these terms. These terms are used to distinguish one element from another element. Thus, a "first" element discussed below could also be termed a "second" element.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Unless explicitly described to the contrary, the word "comprises," and variations such as "comprising," "includes" or "including" will be understood to imply the inclusion of stated elements but not the exclusion of any other elements.

In the specification, when it is described that an element is "connected" or "coupled" to another element, the element may be "directly connected or coupled" to the another element or "indirectly connected or coupled" to the other element through a third element.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompass both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Hereinafter, embodiments of the invention will be described in detail with reference to the accompanying drawings.

FIG. 1 is a perspective view of a display device DD in accordance with an embodiment of the invention.

Referring to FIG. 1, the display device DD may include a plurality of areas divided on a display surface. The display surface may be divided into a display area DA and a non-display area NDA according to whether an image IM is displayed. The display area DA is an area where the image IM is displayed, and the non-display area NDA is an area where the image IM is not displayed. For example, the display device DD shown in FIG. 1 may be a smart phone provided in a quadrangle shape. The display device DD may display an image IM of weather information and icons. The non-display area NDA may be adjacent to or surround the display area DA, and may be omitted in an embodiment of the disclosure.

The display surface may be parallel to a plane formed by a first direction DR1 and a second direction DR2. A normal direction of the display surface may indicate a third direction DR3. The third direction DR3 may indicate a thickness direction of the display device DD. A front surface and a rear surface of each component of the display device DD may be determined by the third direction DR3.

Directions indicated by the first to third directions DR1, DR2, and DR3 may be converted to other directions. In addition, in the present specification, the phrase "viewed on a plane" may mean to view from the third direction DR3.

The display device DD may be folded or unfolded about a folding axis FX. The folded position includes a position in which the foldable display device DD is bent. Specifically, the folded position may be a position in which the display device DD is bent such that a part of the display device DD is inclined to the other part thereof. For example, the display device DD may be folded or unfolded with respect to the folding axis FX disposed in the second direction DR2. The unfolded position may be a position in which a part of the display device DD is placed side by side with the other part thereof to form a substantially planar configuration. Alternatively, the folded position may be a position in which an angle between a part and the other part of the display device DD is about 0 to less than 180 degrees and/or greater than about 180 to less than 360 degrees. The unfolded position may be a position in which an angle between a part and the other part of the display device DD is about 180 degrees.

The display device DD may include a folding area FA folded about the folding axis FX, and a first non-folding area NFA1 and a second non-folding area NFA2 spaced apart from each other with the folding area FA interposed therebetween. The folding axis FX may extend in the second direction DR2. The first non-folding area NFA1 may extend from a first end of the folding area FA in the first direction DR1. The second non-folding area NFA2 may extend from a second end of the folding area FA in the first direction DR1. The first end of the folding area FA may be opposite to the second end of the folding area FA along the first direction DR1.

An upper surface DD-US of the display device DD may include a first display surface PA1 overlapping the folding area FA, a second display surface PA2 overlapping the first non-folding area NFA1, and a third display surface PA3 overlapping the second non-folding area NFA2. A lower surface DD-DS of the display device DD may be a surface facing the upper surface DD-US. Each of the first to third display surfaces PA1, PA2, and PA3 may display an image.

In an embodiment of the disclosure, the display device DD may be a foldable display device as an example, but is not limited thereto, and the display device DD may be applied to various display devices such as a flexible display device, a curved display device, a rollable display device, and a stretchable display device. In addition, the foldable display device according to the disclosure may be used in a large electronic device such as a television or an external billboard, a small and medium-sized electronic device such as a mobile phone, a personal computer, a notebook computer, a personal digital terminal, a car navigation unit, a game machine, a portable electronic device, a wrist watch type electronic device, and a camera, and the like.

Figure 2:
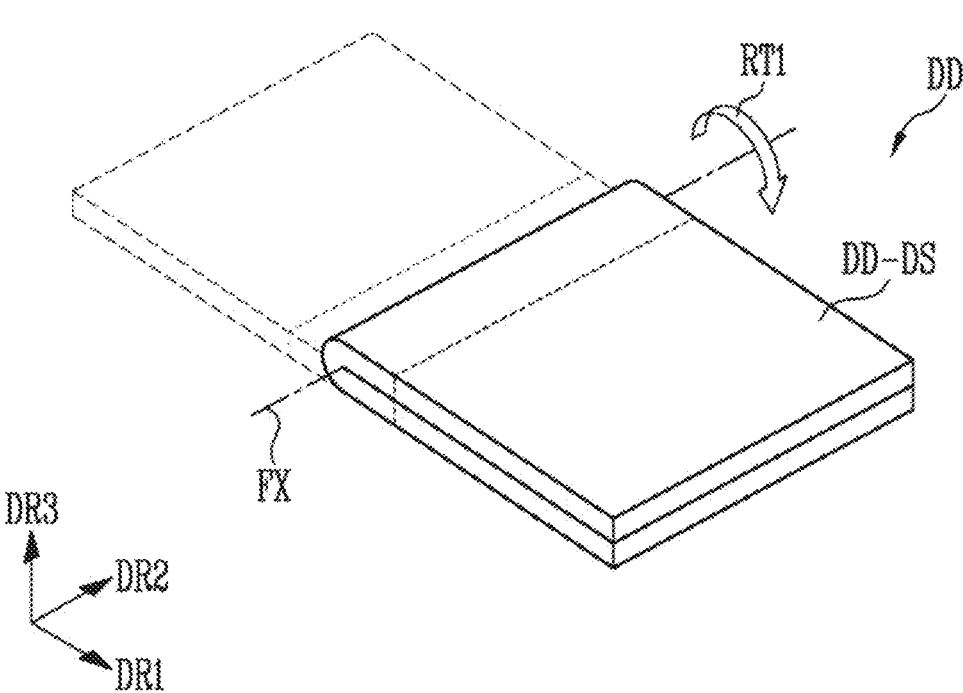
FIG. 2 is a perspective view of a display device folded based on a folding axis in accordance with an embodiment of the invention.

FIG. 2 is a perspective view of the display device DD folded based on the folding axis FX in accordance with an embodiment of the invention.

Referring to FIGS. 1 and 2, the folding area FA may be folded based on the folding axis FX so that the second display surface PA2 and the third display surface PA3 face each other. The folding area FA may be folded along a first rotational direction RT1. The lower surface DD-DS of the display device DD may be exposed to an outside. The upper surface DD-US of the display device DD may not be exposed to the outside in this state.

The display device DD may be folded along the folding axis FX, and this may be referred to as inner folding.

Figure 3:
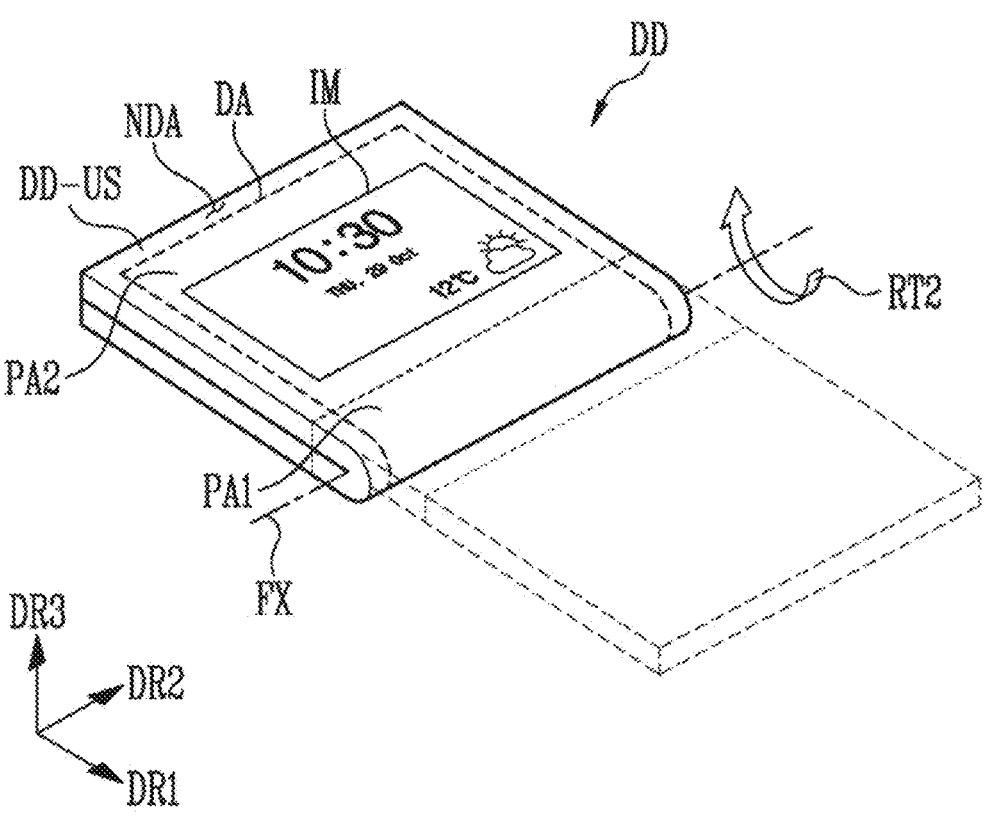
FIG. 3 is a perspective view of a display device folded based on a folding axis in accordance with an embodiment of the invention.

FIG. 3 is a perspective view of the display device DD folded based on the folding axis FX in accordance with an embodiment of the invention.

Referring to FIGS. 1 and 3, the folding area FA may be folded based on the folding axis FX so that the second display surface PA2 and the third display surface PA3 are exposed to the outside. The folding area FA may be folded along a second rotational direction RT2, and the upper surface DD-US of the display device DD may be exposed to the outside. The lower surface DD-DS of the display device DD may not be exposed to the outside in this state.

In other words, the display device DD may be folded along the folding axis FX so that the second display surface PA2 of the first non-folding area NFA1 and the third display surface PA3 of the second non-folding area NFA2 face to the outside. This may be referred to as outer folding.

Figure 4:
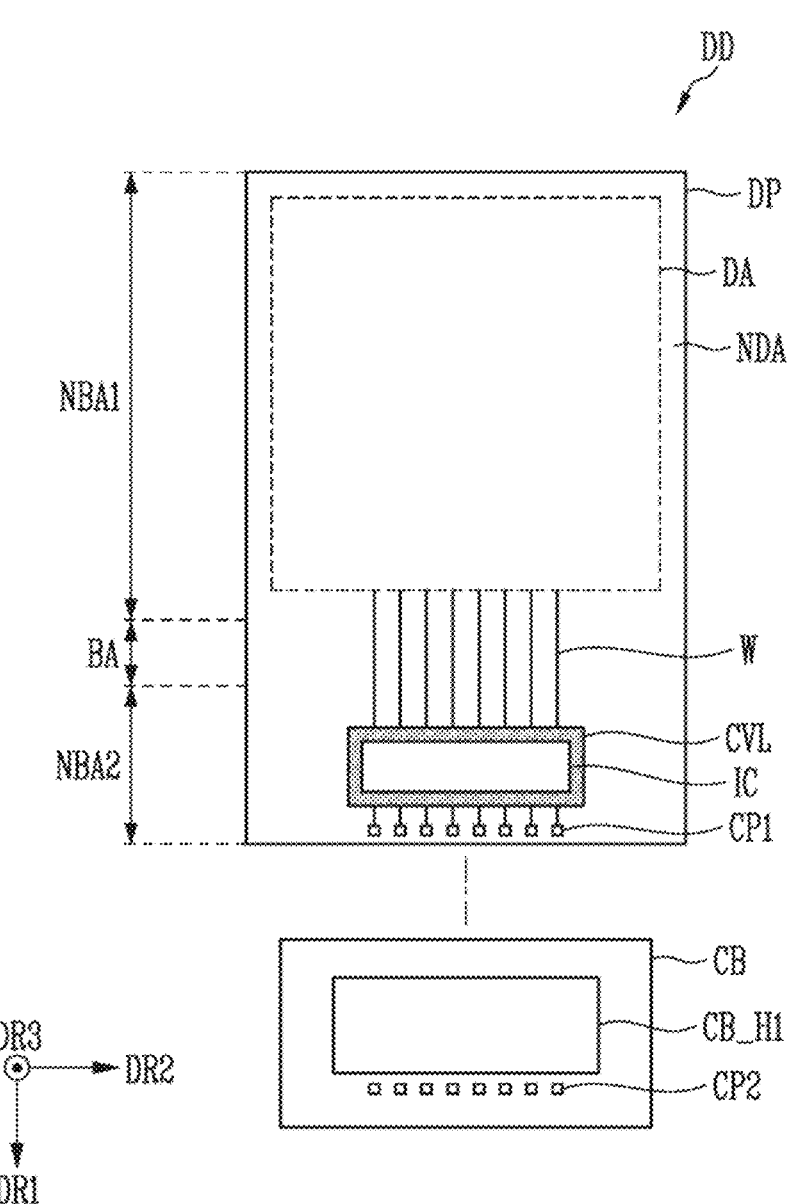
FIG. 4 is a plan view of a display device in accordance with an embodiment of the invention.
Figure 5:
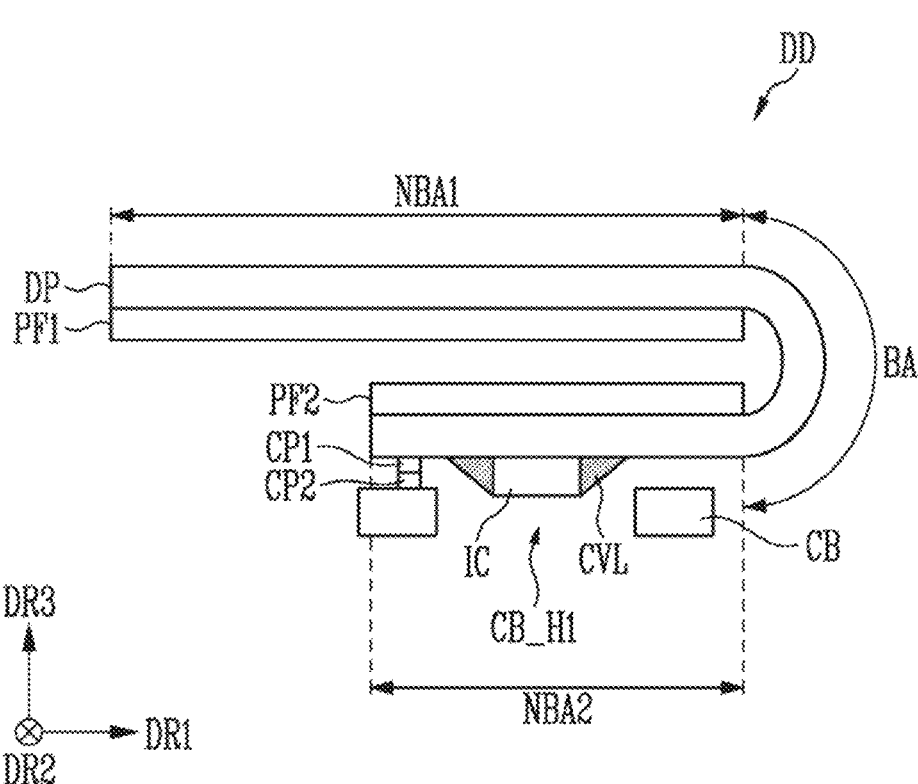
FIG. 5 is a cross-sectional view of a display device in accordance with an embodiment of the invention.

FIG. 4 is a plan view of the display device DD in accordance with an embodiment of the invention. FIG. 5 is a cross-sectional view of the display device DD in accordance with an embodiment of the invention. For convenience of description, FIG. 4 illustrates a plan view in which a connection substrate CB is not coupled to a display panel DP.

Referring to FIGS. 4 and 5, the display device DD may include the display panel DP, a driving chip IC, a plurality of first connection pads CP1, a cover layer CVL, and the connection substrate CB.

The display panel DP according to an embodiment of the disclosure may be a light emitting display panel. For example, the display panel DP may be an organic light emitting display panel, a quantum dot light emitting display panel, a micro LED display panel, or a nano LED display panel.

Pixels and a plurality of lines W connected to the pixels may be disposed in the display area DA. The plurality of lines W may include a data line, a power line, a control signal line, a scan line, an emission control line, and the like.

A driving circuit providing various signals to the pixels may be disposed in the non-display area NDA. The driving circuit may include a scan driving circuit, an emission control driving circuit, and the like.

The display panel DP may include a first area NBA1, a second area BA, and a third area NBA2. The first area NBA1, the second area BA and the third area NBA2 may be arranged along the first direction DR1. The first area NBA1 and the third area NBA2 may be spaced apart from each other with the second area BA interposed therebetween.

The first area NBA1 may be an area for displaying an image and may be an area including the folding area FA, the first non-folding area NFA1, and the second non-folding area NFA2 described with reference to FIG. 1.

The second area BA may be bent in one direction. For example, the second area BA may be bent in a direction opposite to an upper surface DD-US of the display panel DP. In other words, in a direction opposite to the third direction DR3.

The driving chip IC may be a chip in which circuits for driving the display panel DP are integrated. The driving chip IC may output image signals and driving signals for image display. The driving chip IC may be disposed in the third area NBA2 in a method of a chip on plastic (COP), a chip on glass (COG), or the like. The driving chip IC may be connected to the plurality of first connection pads CP1 through the plurality of lines W.

The plurality of first connection pads CP1 may be electrically connected to a plurality of second connection pads CP2 of the connection substrate CB. Accordingly, the plurality of first connection pads CP1 may receive various signals for driving the display panel DP through the connection substrate CB. In addition, the plurality of first connection pads CP1 may be connected to the plurality of lines W extending from the display area DA.

The cover layer CVL may be disposed in the third area NBA2. The cover layer CVL according to an embodiment of the disclosure may contact at least a portion of a side surface of the driving chip IC. For example, the cover layer CVL may surround the side of the driving chip IC. For example, the cover layer CVL may cover at least four lateral sides of the driving chip IC. Thus, the cover layer CVL may protect the driving chip IC from a foreign substance such as water or moisture. To accomplish this, moisture permeability of the cover layer CVL may be 5 to 30 $g/m^3$. In addition, since the cover layer CVL is provided, a cap disposed on the connection substrate CB to protect the driving chip IC may be omitted. Therefore, a thickness of the display device DD may be reduced. In addition, the cover layer CVL may reduce malfunction, damage, or the like of the driving chip IC due to static electricity generated between the driving chip IC and a configuration adjacent to the driving chip IC (for example, the connection substrate CB).

As shown in FIG. 5, a thickness of the cover layer CVL according to an embodiment of the disclosure may decrease as a distance from the driving chip IC increases. In other words, the thickness of the cover layer CVL corresponding to a portion where the cover layer CVL contacts the driving chip IC may be the same as a thickness of the driving chip IC. Additionally, a thickness of a portion of the cover layer CVL spaced apart from the driving chip IC along the first direction DR1 may be less than the thickness of the driving chip IC. In this case, the cover layer CVL may have sloped sidewalls. However, the thickness of the cover layer CVL is not limited to the above-described examples. For example, the cover layer CVL may have the same thickness as that of the driving chip IC and may be formed with a constant thickness.

The cover layer CVL according to an embodiment of the disclosure may include a thermally conductive polymer and a heat dissipation material. Thus, the cover layer CVL may effectively dissipate heat generated from the driving chip IC. For example, the thermally conductive polymer may include at least one of polyethylenedioxythiophene (PEDOT), polysulfonate, polythiophene, polyaniline, polypyrrole, and polyacetylene. For example, the heat dissipation material may include at least one of metal materials such as aluminum, copper, and silver, graphene, and graphite. The cover layer CVL may be formed by ejecting a composite material including the thermally conductive polymer and the heat dissipation material described above on the side surface of the driving chip IC through a jetting method or the like.

Adhesion of the cover layer CVL to the driving chip IC according to an embodiment of the disclosure may be 3.5 N/cm or more. In addition, a modulus of the cover layer CVL may be 250 MPa or more. Thus, the cover layer CVL may be effectively fixed to at least a portion of the side surface of the driving chip IC.

The connection substrate CB may include a first hole CB_H1 and the plurality of second connection pads CP2.

The connection substrate CB may overlap at least a portion of the third area NBA2. The connection substrate CB may be electrically connected to the driving chip IC through the second connection pad CP2. The connection substrate CB may be a flexible printed circuit board (FPCB).

The first hole CB_H1 may overlap the driving chip IC. In addition, the first hole CB_H1 may overlap the cover layer CVL. Accordingly, physical interference (or contact) occurring between the driving chip IC and/or the cover layer CVL and the connection substrate CB may be prevented. Furthermore, since the first hole CB_H1 is formed in the connection substrate CB, the connection substrate CB mostly overlap the third area NBA2, and thus an additional space for disposing parts such as a battery may be secured.

The plurality of second connection pads CP2 may be electrically connected to the plurality of first connection pads CP1. To accomplish this, the plurality of second connection pads CP2 may be formed at a position corresponding to the plurality of first connection pads CP1. The plurality of second connection pads CP2 may be connected to the plurality of first connection pads CP1 in a film on glass (FOG) method.

The display device DD may further include a first protective film PF1 and a second protective film PF2.

The first protective film PF1 may be disposed on a rear surface of the display panel DP. The first protective film PF1 may be disposed in a portion of the display device DD corresponding to the first area NBA1. In other words, the first protective film PF1 may be disposed on a rear surface of the display panel DP in the first area NBA1. The first protective film PF1 may support the first area NBA1 so that the first area NBA1 is not bent when the display panel DP is bent. The first protective film PF1 may include a PET film or the like.

The second protective film PF2 may be disposed on the rear surface of the display panel DP. The second protective film PF2 may be disposed in a portion of the display device DD corresponding to the third area NBA2. In other words, the second protective film PF2 may be disposed on a rear surface of the display panel DP in the third area NBA2. The second protective film PF2 may support the third area NBA2 so that the third area NBA2 is not bent when the display panel DP is bent. The second protective film PF2 may include a PET film or the like.

Figure 6:
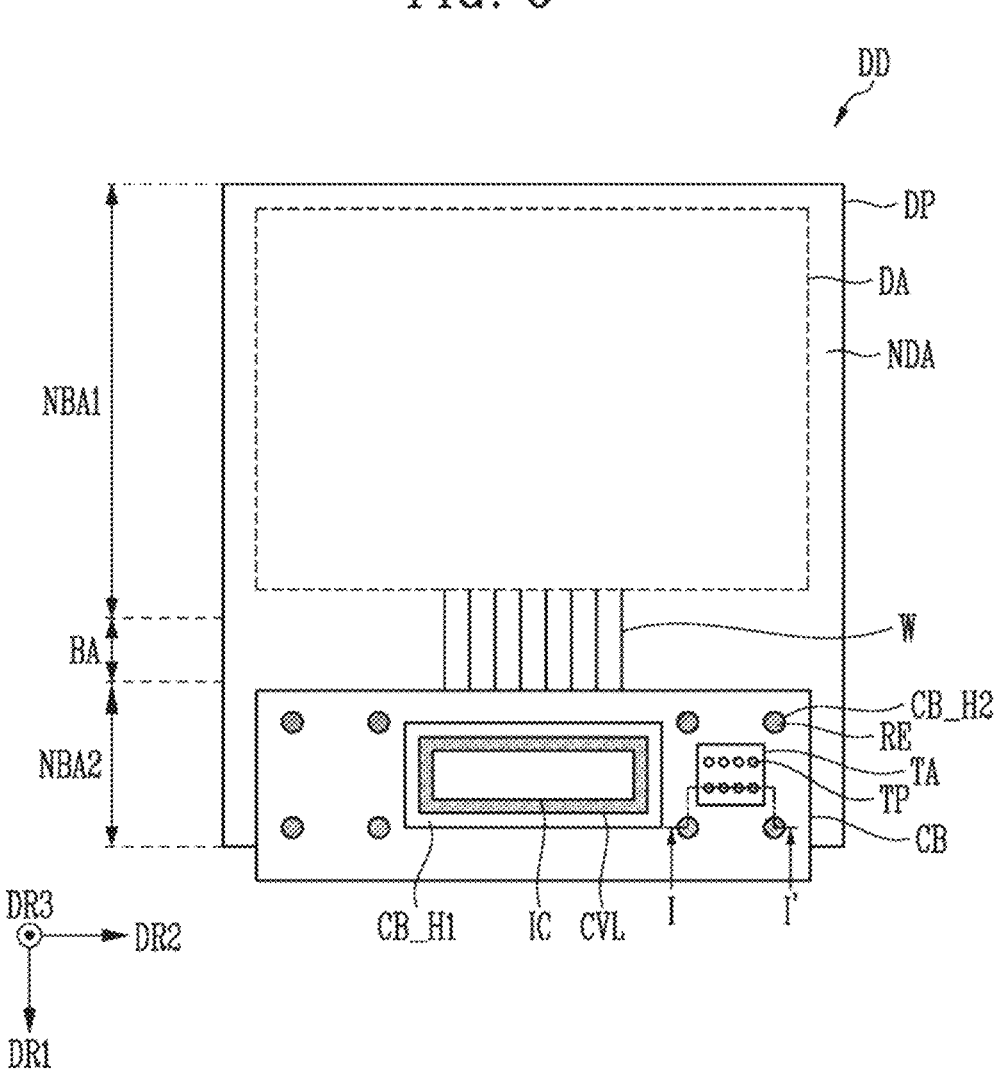
FIG. 6 is a plan view of a display device in accordance with an embodiment of the invention.
Figure 7:
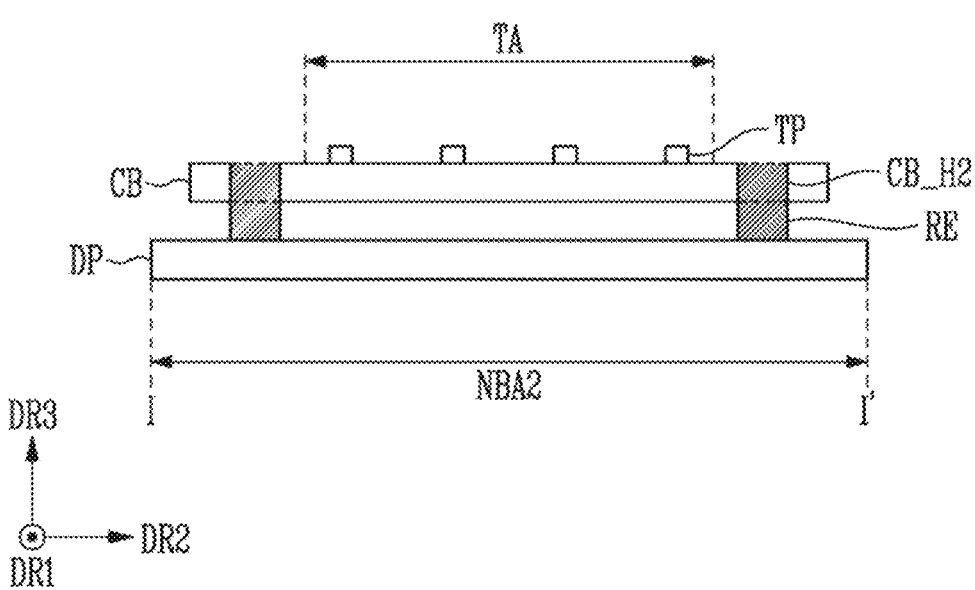
FIG. 7 is a cross-sectional view of the display device taken along a cutting line I-I' shown in FIG. 6.
Figure 8:
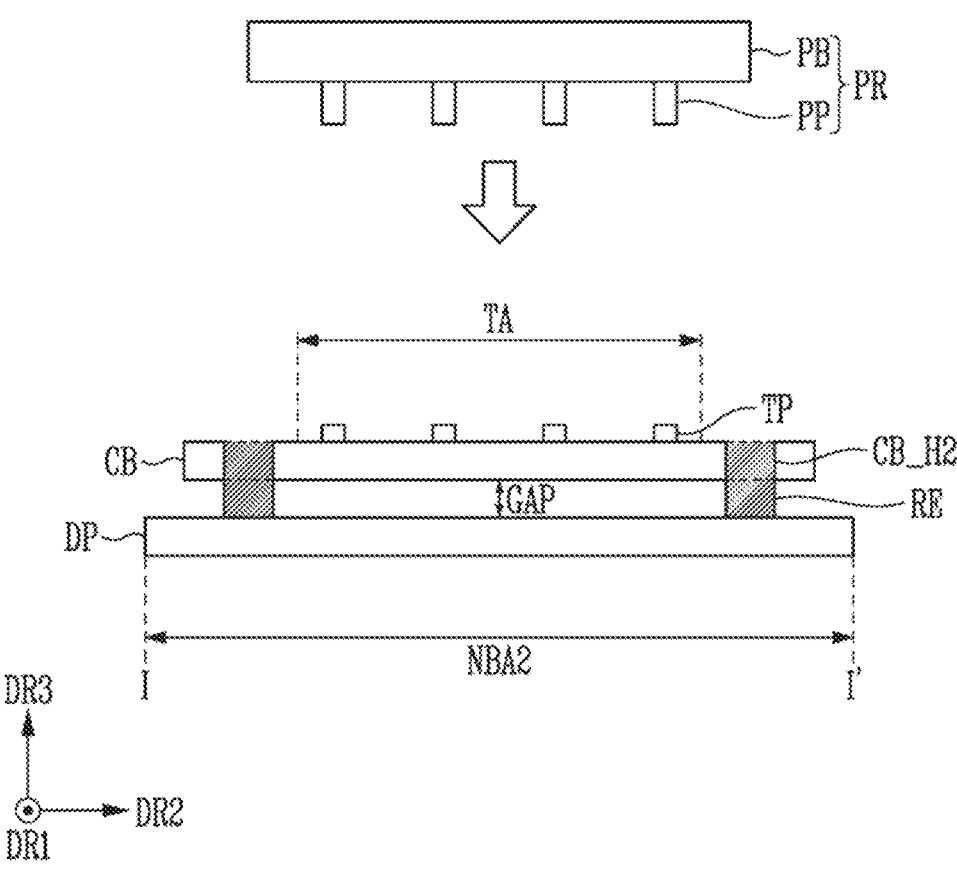
FIG. 8 is a diagram illustrating a bonding defect inspection of a connection substrate.

FIG. 6 is a plan view of the display device DD in accordance with an embodiment of the invention. For convenience of description, FIG. 6 illustrates a plan view in which the connection substrate CB is coupled to the display panel DP. FIG. 7 is a cross-sectional view of the display device DD taken along a cutting line I-I' shown in FIG. 6. FIG. 8 is a diagram illustrating a bonding defect inspection of the connection substrate CB. Regarding FIGS. 6 to 8, the same reference numerals are allocated to the same configurations as those shown in FIG. 4, an overlapping description is omitted, and a difference is mainly described.

Referring to FIGS. 6 and 7, the connection substrate CB according to an embodiment of the disclosure may further include a test area TA, a plurality of test points TP, and a plurality of second holes CB_H2.

The test area TA may be an area for inspecting a bonding defect of the connection substrate CB. For example, the test area TA may be an area for inspecting whether electrical coupling (or connection) between the connection substrate CB and the display panel DP is normally performed, as the connection substrate CB is mounted on the display panel DP. To accomplish this, signal patterns for inspecting the bonding defect of the connection substrate CB may be formed in the test area TA. As shown in FIG. 6, the test area TA may be spaced apart from the first hole CB_H1. However, this is merely an example, and a position and the number of test areas TA may vary according to an inspection condition.

The plurality of test points TP may be formed in the test area TA. The plurality of test points TP may be connected to the signal patterns formed in the test area TA. By measuring a resistance of the test area TA through the plurality of test points TP, whether bonding of the connection substrate CB is defective or not may be inspected. In FIG. 6, eight test points TP are arranged on the connection substrate CB, but the number and an arrangement of the test points TP are not limited to the above-described example.

The plurality of second holes CB_H2 according to an embodiment may be formed to overlap the third area NBA2. This is done to compensate for a step difference GAP (refer to FIG. 8) between the display panel DP and the connection substrate CB. The plurality of second holes CB_H2 may be formed so as not to overlap the test area TA. However, this is merely an example, and the plurality of second holes CB_H2 may be formed to overlap a portion of the test area TA.

The plurality of second holes CB_H2 according to an embodiment of the disclosure may be spaced apart from each other. In FIG. 6, eight second holes CB_H2 are spaced apart from each other by a predetermined distance, but the number, size, and separation distance of the second holes CB_H2 are not limited to those shown in FIG. 6.

The plurality of second holes CB_H2 according to an embodiment of the disclosure may be filled with resin RE. For example, the resin RE may include at least one of acrylic resin, urethane resin, olefin resin, imide resin, amide resin, ester resin, isocyanate resin, epoxy resin, and silicone resin. However, the disclosure is not limited thereto, and the plurality of second holes CB_H2 may be filled with the same material as a material configuring the cover layer CVL.

The resin RE according to an embodiment of the disclosure may pass through the connection substrate CB and contact at least a portion of the third area NBA2. For example, the resin RE filled in the plurality of second holes CB_H2 may extend to contact at least a portion of the third area NBA2. As another example, the resin RE may form a gap between the display panel DP and the connection substrate CB.

Referring to FIG. 8, a probe PR may be pressed to the connection substrate CB to inspect the bonding defect of the connection substrate CB. The probe PR may include a probe body PB and a plurality of probe pins PP. The probe body PB may include circuits for measuring a resistance of the test area TA. The plurality of probe pins PP may be formed at a position corresponding to the plurality of test points TP formed in the connection substrate CB. Accordingly, when the probe PR is pressed to the connection substrate CB, the plurality of probe pins PP and the plurality of test points TP may contact each other.

As shown in FIG. 8, the step difference GAP may exist between the connection substrate CB and the display panel DP. Therefore, physical interference (or contact) between the connection substrate CB and the display panel DP may occur due to pressure applied by the probe PR in a process in which the probe PR is pressed to the connection substrate CB. As a result, a crack may occur in the display panel DP, and thus the display panel DP may be damaged.

In accordance with embodiments of the invention, the resin RE contacting the third area NBA2 of the display panel DP through the plurality of second holes CB_H2 overlapping the third area NBA2 may be formed, and thus, the step difference GAP between the connection substrate CB and the display panel DP may be compensated. Accordingly, damage to the display panel DP may be prevented when the bonding defect of the connection substrate CB is inspected.

The invention should not be construed as being limited to the embodiments set forth herein. Rather, these embodiments are provided so that this disclosure will be thorough and complete and will fully convey the concept of the invention to those skilled in the art.

While the invention has been particularly shown and described with reference to embodiments thereof, it will be understood by those of ordinary skill in the art that various changes in form and details may be made therein without departing from the spirit or scope of the invention as set forth by the following claims.

What is claimed is:

1. A display device comprising:
    a display panel including a first area, a second area that can be bent from the first area, and a third area extending from the second area;
    a driving chip disposed in the third area;
    a connection substrate including a first hole,
    wherein the first hole overlaps the driving chip and the third area; and
    a cover layer disposed in the third area,
    wherein the cover layer contacts a side of the driving chip.

2. The display device according to claim 1, wherein the cover layer is disposed on more than one side of the driving chip.

3. The display device according to claim 1, wherein a thickness of the cover layer decreases as a distance of the cover layer from the driving chip increases.

4. The display device according to claim 1, wherein a thickness of the cover layer is the same as a thickness of the driving chip.

5. The display device according to claim 1, wherein the cover layer includes a thermally conductive polymer and a heat dissipation material.

6. The display device according to claim 5, wherein the thermally conductive polymer includes polyethylenedioxy-thiophene, polysulfonate, polythiophene, polyaniline, polypyrrole, or polyacetylene.

7. The display device according to claim 5, wherein the heat dissipation material includes aluminum, copper, silver, graphene, or graphite.

8. The display device according to claim 1, wherein adhesion of the cover layer to the driving chip is 3.5 N/cm or more.

9. The display device according to claim 1, wherein a modulus of the cover layer is 250 MPa or more.

10. The display device according to claim 1, wherein moisture permeability of the cover layer is 5 to 30 $g/m^3$.

11. The display device according to claim 1, wherein the first hole overlaps the cover layer.

12. The display device according to claim 1, further comprising:
    a first protective film disposed on a rear surface of the first area; and
    a second protective film disposed on a rear surface of the third area.

13. The display device according to claim 1, further comprising:
    a first connection pad disposed in the third area,
    wherein the first connection pad is connected to a line extending from a display area of the display panel.

14. The display device according to claim 13, wherein the connection substrate further includes a second connection pad connected to the first connection pad.

15. The display device according to claim 1, wherein the connection substrate further includes a plurality of test points disposed in a test area.

16. The display device according to claim 15, wherein the connection substrate further includes a plurality of second holes overlapping the third area and spaced apart from each other.

17. The display device according to claim 16, wherein the second holes do not overlap the test area.

18. The display device according to claim 16, wherein the second holes are filled with resin.

19. The display device according to claim 18, wherein the resin contacts the third area.

20. The display device according to claim 18, wherein the resin includes acrylic resin, urethane resin, olefin resin, imide resin, amide resin, ester resin, isocyanate resin, epoxy resin, or silicone resin.

21. A display device comprising:
    a display panel including a first area, a second area bendable from the first area, and a third area extending from the second area, wherein when the second area is bent, the first area overlaps the third area;
    a driving chip disposed in the third area;
    a cover layer disposed on opposite sides of the driving chip; and
    a connection substrate that includes an opening that exposes the driving chip and the cover layer.

* * * * *